(12) United States Patent
Takao

(10) Patent No.: US 6,603,071 B2
(45) Date of Patent: Aug. 5, 2003

(54) FLEXIBLE PRINTED CIRCUIT BOARD, INTEGRATED CIRCUIT CHIP MOUNTING FLEXIBLE PRINTED CIRCUIT BOARD, DISPLAY APPARATUS INCORPORATING, INTEGRATED CIRCUIT CHIP MOUNTED STRUCTURE, AND BONDING METHOD OF INTEGRATED CIRCUIT CHIP MOUNTING FLEXIBLE PRINTED CIRCUIT BOARD

(75) Inventor: Naoki Takao, Soraku-gun (JP)

(73) Assignee: Sharp Kabushiki Kaisha (JP)

( * ) Notice: Subject to any disclaimer, the term of this patent is extended or adjusted under 35 U.S.C. 154(b) by 70 days.

(21) Appl. No.: 09/893,660

(22) Filed: Jun. 29, 2001

(65) Prior Publication Data
US 2002/0050381 A1 May 2, 2002

(30) Foreign Application Priority Data
Jul. 5, 2000 (JP) ........................................ 2000-204297
Jun. 8, 2001 (JP) ........................................ 2001-174778

(51) Int. Cl.[7] ............................................. H01L 23/499
(52) U.S. Cl. ........................ 174/52.1; 257/666; 257/674; 257/692
(58) Field of Search ............................... 174/52.1, 52.4; 257/666, 668, 672, 673, 674, 676, 778, 690, 692, 694

(56) References Cited

U.S. PATENT DOCUMENTS

| 5,442,229 A | * | 8/1995 | Mori et al. .................. 257/666 |
| 6,018,189 A | * | 1/2000 | Mizuno ....................... 257/668 |
| 6,036,173 A | * | 3/2000 | Neu et al. .................... 257/668 |

FOREIGN PATENT DOCUMENTS

JP 9-260579 10/1997

* cited by examiner

Primary Examiner—Dean A. Reichard
Assistant Examiner—Carmelo Oliva
(74) Attorney, Agent, or Firm—Nixon & Vanderhye PC

(57) ABSTRACT

An IC chip mounting FPC board of the present invention is provided with (1) a mounting region in a substantially quadrangular shape for mounting an IC chip, and (2) a plurality of inner-leads provided along each side of the mounting region, for being connected with the bumps of the IC chip so that the IC chip is mounted and bonded in the mounting region, in which the inner-leads is provided so as to have substantial equality between (a) a sum of areas of superimposing regions of the inner-leads provided on one of facing two sides, and (b) a sum of areas of superimposing regions of the inner-leads provided on the other of the facing two sides. Because this substantially equalizes the pressures applied on the respective inner-leads during the mounting of the IC chip, preventing the bonding pressure of the mounting from being unbalance, it is possible to provide an IC chip mounting FPC board having a high bonding reliability.

18 Claims, 4 Drawing Sheets

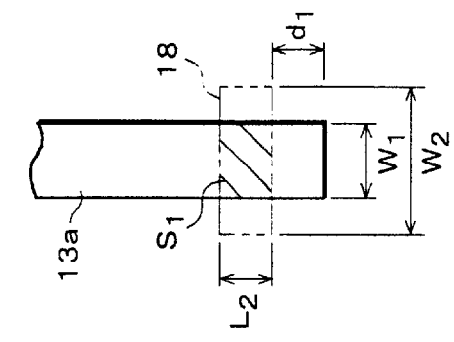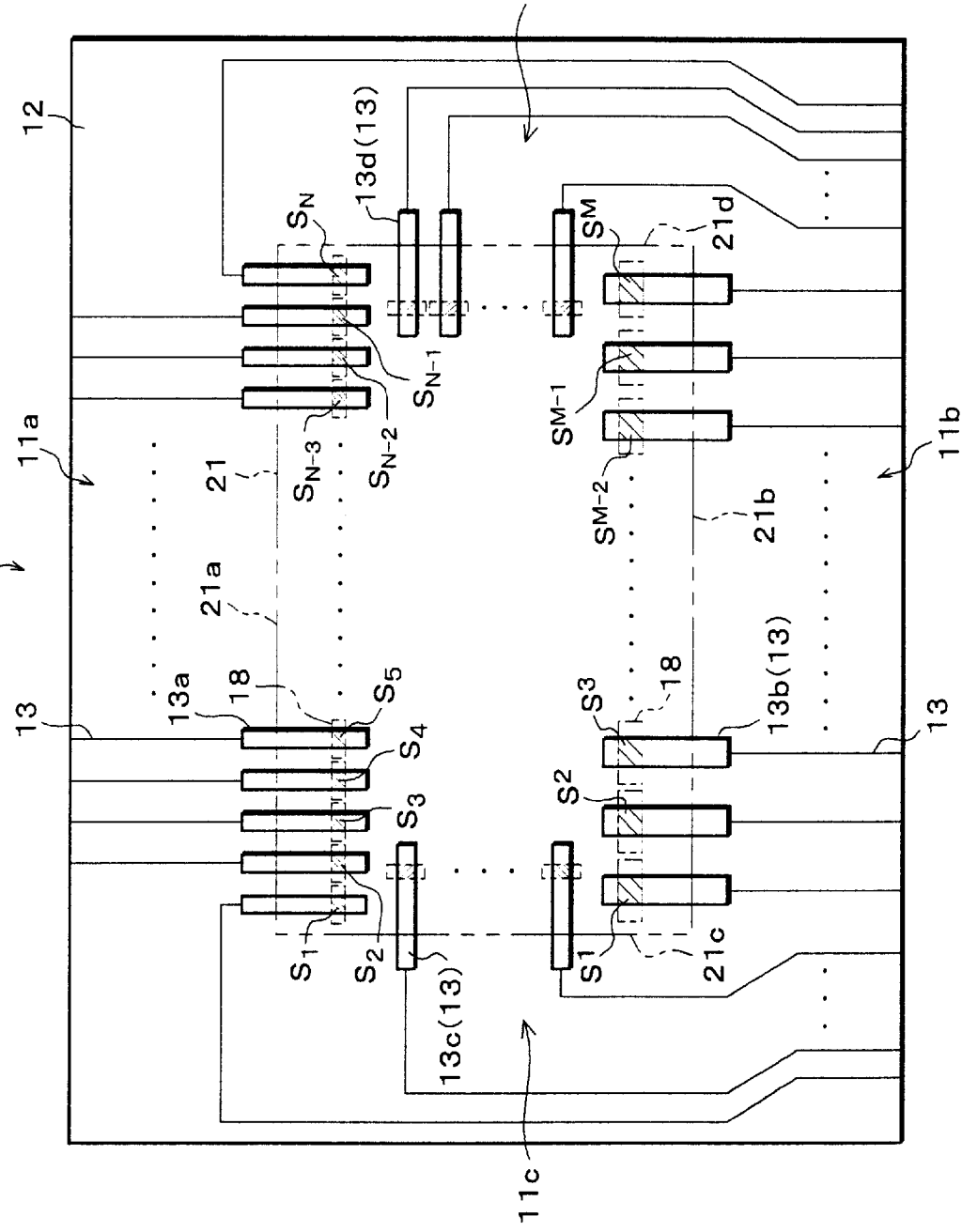

FLEXIBLE PRINTED CIRCUIT BOARD, INTEGRATED CIRCUIT CHIP MOUNTING FLEXIBLE PRINTED CIRCUIT BOARD, DISPLAY APPARATUS INCORPORATING, INTEGRATED CIRCUIT CHIP MOUNTED STRUCTURE, AND BONDING METHOD OF INTEGRATED CIRCUIT CHIP MOUNTING FLEXIBLE PRINTED CIRCUIT BOARD

FIELD OF THE INVENTION

The present invention relates to a flexible printed circuit board and an integrated circuit chip mounting flexible printed circuit board that have suitable properties for being mounted on a display panel, such as a liquid crystal display panel, and to a display apparatus incorporating same. The present invention also relates to an integrated circuit chip mounted structure and a bonding method of the integrated circuit chip mounting flexible printed circuit board. Especially, the present invention relates to a flexible printed circuit board and an integrated circuit chip mounting flexible printed circuit board that are provided with a wiring structure characteristic in its length and width, and an excellent bonding reliability with respect to an integrated circuit chip, and further relates to a display apparatus incorporating same.

BACKGROUND OF THE INVENTION

An example of a conventional method of mounting a integrated circuit (IC) chip on a flexible printed circuit (FPC) board, which is to be mounted on a liquid crystal display panel, is a inner-lead bonding method that makes good use of an Au—Sn eutectic reaction.

In general, the bonding method is employed to bond an IC chip having bumps of Au (gold), and an FPC board having three layers, namely a PI (polyimid) film as a board main body, an adhesive agent layer, and copper-foiled wires with a Sn (tin)-plated surface, which is fixed on the PI film by the adhesive agent layer. The copper-foiled wires and the bumps are treated by thermocompression bonding so as to create a molten Au—Sn alloy in a bonding interface between the copper-foiled wires and the bumps. As a result, the three-layered FPC board and the IC chip are electrically connected. Moreover, the joint parts are reinforced and protected by applying a resin around the IC chip after the IC chip is mounted.

However, to cope with recent demand for a greater output, the pitches between the bumps of the IC chip has been rapidly reduced so as to provide an IC chip with fine-pitched bumps. As an FPC board for such an IC chip, employed is a two-layered FPC board, which is an FPC board having a similar structure as the conventional FPC board, that is the three-layered FPC board, but having no adhesive agent layer. In the two-layered FPC board, the copper-foiled wires are directly provided on the PI film as the board main body by applying a plating or an etching method. Compared with the three-layered FPC board, the two-layered FPC board has an advantage that the copper-foiled wires are accurately positioned with fine pitches, while such a problem is posed that adhesion of the copper-foiled wires onto the PI film is weak.

When those FPC board and IC chip with fine pitches are bonded, it is not rare to have undesirable problems, such as, inadequate electrical connection reliability due to insufficient thermocompression bonding. In other words, without a concrete rule in terms of designing and production of the IC chip mounting FPC board, the wires of the IC chip and the FPC board cannot be electrically connected to each other sufficiently. This may causes an open phenomenon or a leakage, for example, because of misregistration between the joint parts of the IC chip and that of the FPC board, in contact. Thus, it is very important for attaining good bonding reliability that pressures (load per unit area) are evenly applied onto each copper-foiled wire during the thermocompression bonding, and the misregistration and twisting of the bonded two layers are prevented, when the two layers are bonded each other. Those points are especially important when the bonding is carried out by using an anisotropic conductive material, which is prepared by defusing conductive particles in a thermohardening resin. A typical example of the thermohardening resin is an epoxy resin, while the conductive particles may be resin particles treated by plating or metal particles, for example.

As an example of a terminal structure (a wiring structure) of the IC chip mounting FPC board, presented here is a terminal structure having a mounting region in a rectangular shape that corresponds to a shape of the IC chip to be mounted. Such a terminal structure is provided with the copper-foiled wires (inner-leads) for bonding in the mounting region. The inner-leads are disposed on facing two sides of the mounting resin, while numbers of the inner-leads may be same or different between the facing two sides, while the inner-leads are identical in terms of a width.

In such a terminal structure having the inner-leads that have an identical width and are disposed in the same number on each of facing two sides of the mounting region for the IC chip, the pressure on each inner-lead is applied substantially equal between the respective facing two sides of the mounting region during the thermocompression bonding, as long as all the inner-leads are respectively connected with the associating bumps (that is, bumps to be connected with the inner-leads) that are disposed on the IC chip. Especially, it is possible to attain good connection when the anisotropic conductive material is used. However, for example, in case some of the inner-leads are not connected with the bumps and left over, the respective inner-leads may be unevenly pressured during the thermocompression bonding due to a difference in total areas of superimposing parts of the inner-leads for overlapping with the bumps (that is, the bump-associating contacting parts locating on bonding parts of the inner-leads) (hereinafter, just refer to as an superimposing region) between the facing two sides of the mounting region. This may result in inadequate bonding. Moreover, with a structure having different numbers of the inner-leads respectively on the facing two sides of the mounting region, the two sides may be similarly pressured unevenly during the thermocompression bonding, because of the difference in the total areas of superimposing regions of the inner-leads between the facing two sides.

In short, to uniform the width of the inner-leads and the wire pitches is not sufficient enough to attain the even pressure applied on each bonding interface between the bump on the IC chip and the copper-foiled wires on the FPC board. Hence, in order to solve the problem of unbalance pressure during the thermocompression bonding, it is necessary to have, for example, a structure in which the IC chip is mounted on an FPC board provided with wiring that is able to absorb an effect of the unbalance between the pressures applied onto the respective joint parts of the facing two sides due to the difference between the numbers of output terminals (the bumps) provided on the facing two sides of the IC chip.

In order to carry out a mass production while ensuring realization of a mounting structure with the consideration of the pressure balance between the facing two sides of the mounting region for the IC chip, it is required to design the copper-foiled wires on the FPC board in view of, for example, positioning accuracy for the IC chip mounting. For instance, a length of the inner-leads can be designed to be extended toward the circuit with respect to positions of the bumps, in order to absorb an effect of the misregistration. However, the extension should not be longer than a certain upper limit, lest that it cause drawbacks such as leakage due to terminals twisted during the thermocompression bonding of the IC chip. Moreover, the width of the inner-leads need be designed to be thinner than the width of the bumps, so that no leakage is caused between the terminals even when the misregistration happens.

Furthermore, in case there are a large difference in the numbers of the inner-leads between the facing two sides of the mounting region for the IC chip, the above designs may not be sufficient enough to substantially equalize the total areas of the superimposing regions between the facing two sides. This case may be countered by setting a minimal requirement for a ratio between the total areas of the superimposing regions of the facing two sides. Satisfying the minimal requirement for the ratio will achieve a regular supply of an IC chip mounting FPC board provided with a stable quality.

SUMMARY OF THE INVENTION

The present invention has an object of offering an FPC board and an IC chip mounting FPC board with a design to balance a bonding pressure onto each joint part and with excellent bonding reliability. With the design, each joint part is evenly pressured even when facing two sides of an IC chip in a substantially quadrangular shape have different numbers of output terminals (bumps), in other words, when difference numbers of inner-leads are respectively provided on facing two sides of a mounting region in which the IC chip is mounted on the FPC board. Another object of the present invention is to offer a display apparatus incorporating same, while its still another object is to offer a bonding method of the IC chip mounting FPC board. Moreover, yet another object of the present invention is to offer an IC chip mounted structure in which an IC chip is mounted on the FPC board.

In order to achieve the objects, the IC chip mounting FPC board of the present invention is provided with (1) a mounting region in a substantially quadrangular shape for mounting an integrated circuit chip, (2) a plurality of inner-leads, provided along each side of the mounting region, for being connected with bumps of the integrated circuit chip so that the integrated circuit chip is mounted and bonded in the mounting region, wherein the inner-leads are provided so as to have substantial equality between (a) a sum of areas of superimposing regions for the inner-leads provided on one of facing two sides and the bumps, and (b) a sum of areas of superimposing regions for the inner-leads provided on the other of the facing two sides and the bumps.

With the arrangement, achieved is substantial equality between (a) the sum of the areas of the superimposing regions of the inner-leads provided on one of facing two sides, and (b) the sum of the areas of the superimposing regions of the inner-leads provided on the other of the facing two sides. This equality leads to substantial evenness in the pressure applied on the inner-leads when the IC chip is mounted on the mounting region. This prevents the bonding pressure during the IC chip mounting from being unbalanced. Thus, it is possible to realize the IC chip mounting FPC board with the high bonding reliability.

For a fuller understanding of the nature and advantages of the invention, reference should be made to the ensuing detailed description taken in conjunction with the accompanying drawings.

BRIEF DESCRIPTION OF THE DRAWINGS

FIGS. 1($a$) and 1($b$) are plane views illustrating a terminal structure of an IC chip mounting FPC board in accordance with an embodiment of the present invention.

DESCRIPTION OF THE EMBODIMENTS

Figure 2:
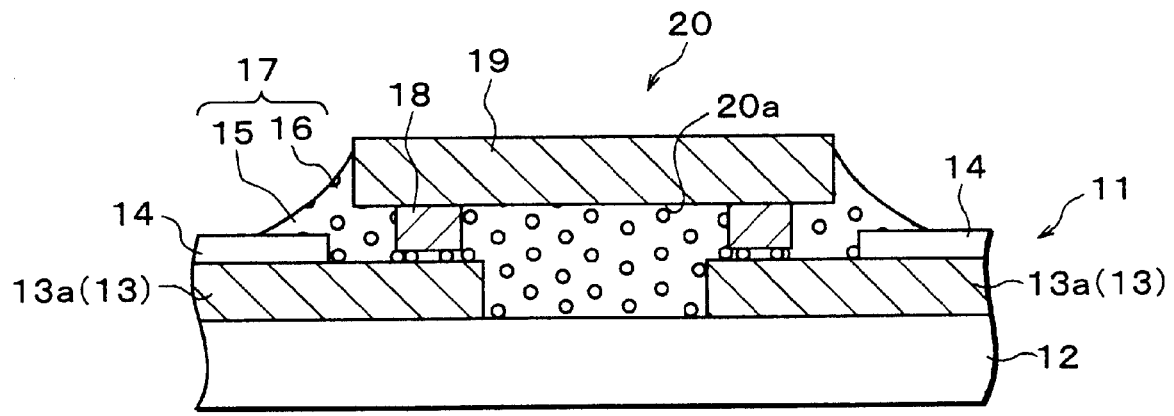
FIG. 2 is a sectional view of an IC chip mounted structure in which an IC chip is mounted on the IC chip mounting FPC board shown in FIG. 1($a$).

Described below is an embodiment of the present invention, with reference to FIGS. 1($a$) and 1($b$) through 4. It should be noted that, the present invention is not limited by the embodiment.

In an FPC board provided with a semiconductor IC chip, such as LSI (large Scale Integration), and its mounting structure of the present embodiment, the IC chip is mounted by using an anisotropic conductive film (ACF) or an anisotropic conductive paste (ACP). The mounting structure is arranged according to a designing rule that ensures bonding reliability between the IC chip and the FPC board, even if wire pitches are narrower than usual and different numbers of wires are disposed on respective sides of a mounting region, or even when misregistration may be caused by continuous operation, such as mass production.

Shown in FIG. 1($a$) and 2 is a two-layered FPC board 11, which is an FPC board in accordance with the present embodiment. The two-layered FPC board 11 is made of two layers, namely, a board 12 and copper-foiled wires 13. The board 12 is a main body of the two-layered FPC board 11, and is made of polyimide or a polyester-type resin, such as polyethylene terephthalate (PET) and polyethylene naphthilate (PEN), which are cheaper in price compared with polyimide. The copper-foiled wires 13 are directly provided on a surface of the board 12 by a method such as plating and etching, with no help of an adhesive agent layer. Moreover, one end of the copper-foiled wire 13 is provided with an inner-lead (a terminal section) 13$a$, which is for bonding with a bump 18 (which is associated with the inner-lead 13$a$) of an IC chip 20 (see FIG. 2), while the other end of the copper foiled wire 13 is provided with an output terminal or an input terminal (not shown).

The following is a detailed explanation on a wiring designing rule for the copper-foiled wires 13, referring to a plane view of the two-layered FPC board 11 shown in FIG. 1($a$). On a surface of the rectangular two-layered FPC board 11, on which the copper-foiled wires 13 are provided, provided are a connection region 11$a$ on a side for input (hereinafter just referred to as the connection region 11$a$), a connection region 11$b$ on a side for output (hereinafter just referred to as the connection region 11$b$), a connection region 11$c$, and a connection region 11$d$. The connection region 11$a$ is on a long side of the two-layered FPC board 11, while the connection region 11b is on another long side. The connection region 11c is on a short side, while the connection region 11d is on the other short side. Furthermore, the two-layered FPC board 11 is provided with a mounting region 21 substantially at the center. The two-layered FPC board 11 is provided with input terminals (not shown) on an edge associated with the connection region 11a, while being provided with output terminals (not shown) on other three edges associated with the connection regions 11b, 11c, and 11d.

Moreover, the mounting region 21 is a region where the IC chip 20 (see FIG. 2) is mounted in. To be concrete, the mounting region 21 is a region of the two-layered FPC board 11 which faces a circuit-formed surface (a surface of the IC chip 20 to face the two-layered FPC board 11) (hereinafter may be referred to as a facing side of the IC chip 20) 20a of the IC chip 20. The mounting region 21 is in a rectangular shape (a substantially quadrangular shape), in accordance with a shape of the IC chip 20 to be mounted. Here, meant by the wordings "substantially quadrangular shape" are any shape having four sides, for example, a quadrangular shape with no corner.

In the mounting region 21, in accordance with shapes and positions of bumps 18 of the IC chip 20 to be mounted, inner-leads 13a to 13d, which are one end of copper-foiled wires 13, are formed so as to be extended into the mounting region 21. To be concrete, the copper-foiled wires 13 are installed in accordance with formation positions of the bumps 18, so that the inner-leads 13a to 13d are extended from an outside to an inside of the mounting region 21, in other words, extended over a boundary between the outside and the inside of the mounting region 21.

In the present embodiment, a plurality of the inner-leads 13a to 13d, which are positioned to enter into the mounting region 21, are categorized into four groups, considering their locations, namely: (1) the inner-leads 13a, which are disposed over a long side 21a of the mounting region 21, provided in an N number, (2) the inner-leads 13b, which are disposed over the other long side 21b, which faces the long side 21a, of the mounting region 21, provided in an M number, (3) the inner-leads 13c, which are disposed over a short side 21c of the mounting region 21, provided in a plurality, (4) the inner-leads 13d, which are disposed over a short side 21d, which faces the short side 21c, of the mounting region 21, provided in a plurality. Needless to say, wordings "a pair of the facing two sides of the mounting region" indicates a pair of the long sides 21a and 21b, or that of the short sides 21c and 21d, while wordings "the inner-leads 13a to 13d disposed associated with the respective sides of the mounting region 21" means the inner-leads 13a to 13d that are disposed over the respective sides.

For example, the two-layered FPC board 11 shown in FIG. 1(a) are provided with the inner-leads 13a and 13b that are disposed so as to associated with the long sides 21a and 21b, which are one of the pairs of the facing two sides. In other words, the inner-leads 13a and 13b are facing each other in the mounting region 21. The inner-leads 13a and 13b are connected to the bumps 18 of the IC chip 20 via an anisotropic conductive material 17 (see FIG. 2). Noted that, the numbers (M and N, respectively) of the inner-leads 13a and 13b are arranged to be different from each other, that is, M≠N.

It should be noted that, counted in the numbers of the inner-leads 13a to 13d are only those of inner-leads 13a to 13d that are actually associated with the bumps 18 when the IC chip 20 is mounted by using the anisotropic conductive material 17. Thus, inner-leads 13a to 13d associating with no bumps 18 are not included in the numbers. In addition, the bumps 18 to be associated with the inner-leads 13a to 13d may or may not be electrically connected with wiring of the IC chip 20 (that is, may be dummy bumps). Similarly, the inner-leads 13a to 13d may be dummy terminals that is not electrically connected, as long as they are associated with bumps 18.

On the respective inner-leads 13a to 13d, there are regions that are superimposed with the associating bumps 18. The region is in accordance with a direction of the thermocompression bonding (along a vertical direction with respect to the surface of the board 12, see FIG. 2) during the mounting of the IC chip 20. In FIG. 2, shown are examples of such regions, which are associated with bumps 18 via the anisotropic conductive material 17. The regions located on the top of the inner-leads 13a to 13d are called the superimposing regions. Note that, in FIG. 1(a), labelling is done only for superimposing regions $S_1$ to $S_N$ associated with the long side 21a, and superimposing regions $S^1$ through $S^M$ associated with the long side 21b, which faces the long side 21a. Meanwhile, only superimposing regions $S_1$ is enlarged and illustrated in FIG. 1(b).

It is obvious in FIG. 1(b) that areas the respective superimposing regions are determined by multiplying a length $L_2$ of the bump 18 by a width $W_1$ of the inner-lead 13a, regarding the two-layered FPC board 11 with such an arrangement. Moreover, in the two-layered FPC board 11 of the present embodiment, while the numbers of the inner-leads disposed are different among the sides of the mounting region 21, it is arranged so as to have (substantial) equality between sums of areas of the superimposing regions of the inner-leads provided on the respective facing two sides, for example, the long sides 21a and 21b of the mounting region 21. In other words, it is arranged that a sum S(N) of areas of the superimposing regions $S_1$ through $S_N$ of the inner-leads 13a in the N number is substantially equal to a sum S(M) of areas of the superimposing regions $S^1$ through $S^M$ of the inner-leads 13b in the M (≠N) number, by designing the widths or lengths of the inner-leads 13a and 13b.

Especially, the use of the bonding method of the anisotropic conductive material, such as ACF, requires accurate control in areas of the contacting (superimposing) parts for bumps of an IC chip and wires (inner-leads) of an FPC board, and in pressure loads that is applied on the contacting parts. If the control is inadequate, conductive particles in the anisotropic conductive material will not be crushed sufficiently and evenly. As a result, the bumps and the inner-leads will not be electrically connected with a high reliability. Especially, in the case where the facing two sides in the mounting region for the IC chip are provided with different numbers of the inner-leads, there is likely a big difference in the sums of the areas of facing surfaces (facing regions on the joint parts: a synonym of the superimposing region) of the inner-leads associated with the bumps. This will result in an uneven pressuring load (that is, a pressure) per unit area on the region during the thermocompression bonding. For example, this problem is not solved with satisfaction in a practical sense by the conventional method, in which an FPC board is provided with dummy inner-leads in areas with no wiring.

However, in the wiring structure (terminal structure) of the FPC board of the present embodiment, the N+M numbers of the inner-leads 13a and the inner-leads 13b are substantially evenly pressured during the mounting of the IC chip 20, because there are substantial equality between the sums S(N) and S(M) of the superimposing regions.

In short, in the present embodiment, as to a soft FPC board to be provided with a semiconductor chip by using an anisotropic conductive material, the wiring of the inner-leads are designed so as to be pressured evenly on the respective joint parts (so as to ensure pressuring balance) during the bonding (the thermocompression bonding) of the FPC board and the IC chip, for example, even when there is a difference in numbers of the output terminals (the bumps) between facing two sides of the semiconductor IC chip in a substantially quadrangular shape. Thus, when the two-layered FPC board is designed, as discussed above, a length and a width of the copper-foiled wires provided on the board 12 are designed in accordance with the shape of the bumps to be connected of the IC chip 20 (see FIG. 2), so as to absorb the effect of the unbalance in the bonding pressure between the two-layered FPC board 11 and the IC chip 20 at the mounting. As a result, it is possible to attain an IC chip mounting FPC board, in which the IC chip 20 is mounted on the FPC board having excellent reliability in terms of the electrical connection, even in case of the continuous operation, such as the mass production.

In the present embodiment, when it is said "regarding the facing two sides of the mounting region, there is substantial equality between the sums of the areas of the superimposing regions of the inner-leads on the respective sides, or the sums of the widths of the inner-leads", it means that a greater equality is attained between the sums of the areas of the superimposing regions (or, between the sums of the widths of the inner-leads) in the present embodiment, compared with those in the conventional method, in which all the inner-leads have an identical width. Referring to FIG. 1(a), a detailed explanation is given here. When the inner-leads 13a and 13b are provided in the N and M numbers, respectively, between the facing two sides 21a and 21b, and N is greater than M, it is designed that smaller one of the sums of areas of the superimposing regions (S(N) and S(M)) is greater than or equal to M/N×100% and less than or equal to 100% of greater one of the sums.

In short, the superimposing regions are formed so that $S(N) \times M/N \leq S(M) \leq S(N)$ is satisfied, as to S(N) and S(M).

Especially, in case there is a great difference between the numbers of the inner-leads 13a and 13b (for example, where N×0.7>M), supposing the sum S(N)≤the sum S(M), it is possible to maintain the connection between (a) the inner-leads 13a and 13b and (b) the bumps 18 in a good condition. This was deduced from a result of a reliability test that was carried out in a high temperature and a high humidity. In the test, examined were an IC chip mounting FPC boards which had been prepared with designs of M/N<0.7, and of M/N≦0.7, respectively. The result showed that there was a significant difference between the IC chip mounting FPC boards in terms of the reliability of the electrical connection between the IC chip 20 and the IC chip mounting FPC board, that is, the IC chip mounting FPC board of the design of M/N<0.7 had drawbacks due to the unbalance between the facing two sides in terms of the sums of the areas of the superimposing region for the bumps 18 and the inner-leads 13a and 13b.

Moreover, where the numbers M and N are differed from each other, it is more preferable that the sums S(M) and S(N) of the areas of the superimposing regions are uniformed with ±5% differences (alternatively, the sums of the widths of the inner-leads 13a to 13d are uniformed with ±5% differences). This maintains the connection in a much better condition.

In addition, as an example of the two-layered FPC board 11, in which the widths and lengths of the inner-leads 13a and 13b are designed so that the sum S(N) of the areas of the superimposing regions $S_1$ to $S_N$ of the inner-leads 13a disposed on the long side 21a in the N numbers is equal to the sum S(M) of the areas of the superimposing regions $S^1$ to $S^M$ of the inner-leads 13a disposed on the long side 21b in the M (M≠N) numbers, presented here is a two-layered FPC board 11 in which the sum of widths (the width $W_1$ shown in FIG. 1(b)) of the inner-leads 13a on the long side 21a is (substantially) equal to the sum of the widths of the inner-leads 13b on the long side 21b.

In this arrangement, as discussed previously, the respective inner-leads 13a to 13d are positioned with a predetermined margin in accordance with a size and setting position of the associating bumps 18 (see FIG. 1(b)), while the bumps 18 are formed with approximate uniformity in the length $L_2$. With this arrangement, the sums of the areas of the superimposing region (the sums of the width of the inner-leads 13a to 13d×the length $L_2$) can be specified simply by specifying the widths of the inner-leads 13a to 13d.

Figure 3:
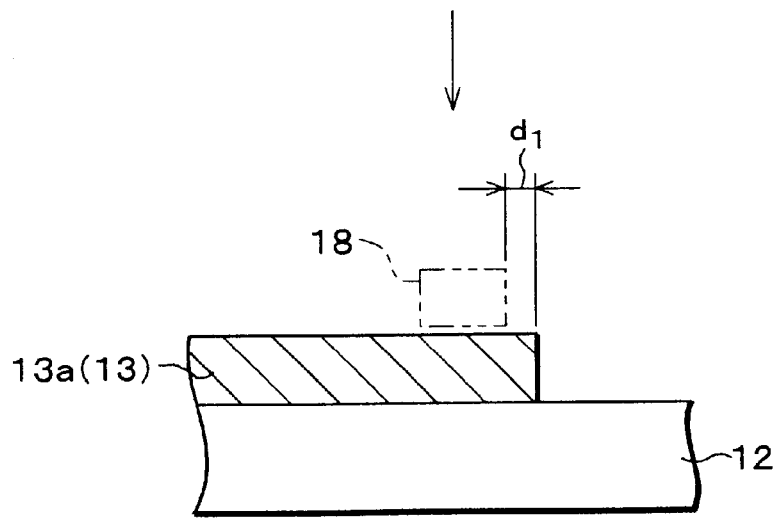
FIG. 3 is a enlarged partial view of the IC chip mounted structure illustrated in FIG. 2.
Figure 4:
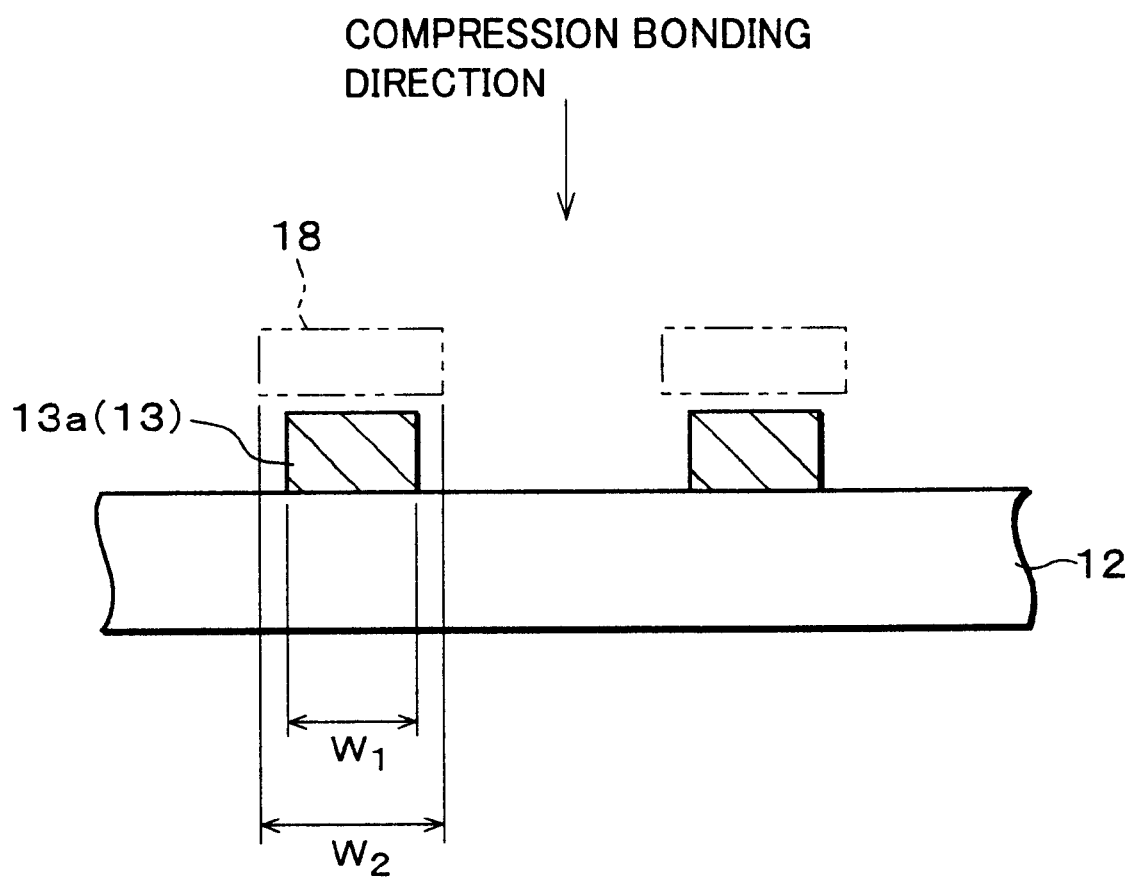
FIG. 4 is another sectional view illustrating an IC chip mounted structure in which an IC chip is mounted on the IC chip mounting FPC board shown in FIG. 1($a$).

With reference to FIGS. 2 through 4, presented below is a method of mounting the IC chip 20 on the two-layered FPC board 11 by using the anisotropic conductive material 17, and the wiring designing rule for the inner-leads 13a to 13d. Note that, FIG. 2 is a cross sectional view of the IC chip mounted structure, in which the IC chip 20 on the two-layered FPC board 11, shown in FIG. 1(a), taken on a line that vertically crosses the long sides 21a and 21b of the mounting region 21 and passes through the inner-leads 13a and 13b. FIG. 3 is an enlarged partial view of FIG. 2, while FIG. 4 is a cross sectional view of the IC chip mounted structure in which the IC chip 20 is mounted on the two-layered FPC board 22 shown in FIG. 1(a), taken on a line that vertically crosses the short sides 21c and 21d of the mounting region 21 and passes through the bumps 18.

As shown in FIG. 2, the IC chip 20, which is to be mounted on the mounting region 21 (see FIG. 1(a)) of the two-layered FPC board 11, is provided with a die 19, on which electric wiring is provided to face a circuit-formed surface 20a, and bumps (connection terminals) 18 made of gold. Moreover, the anisotropic conductive material 17, which is for bonding and electrically connecting the two-layered FPC board 11 and the IC chip 20, is prepared, for example, by dispersing particles 16 having a conductive property in an epoxy resin, which is a thermohardenig resin that can act as an adhesive agent. The anisotropic conductive material 17 is hardened for adhering at application of heat and a pressure in a certain condition.

Prior to the mounting of the IC chip 20, the anisotropic conductive material 17 is applied on the mounting region 21 and in a vicinity of the mounting region 21 of the two-layered FPC board 11. ACF is chosen as the anisotropic conductive material 17, here. Subsequently, the inner-leads 13a to 13d and the associating bumps 18 are positioned by using an IC chip mounting apparatus (not shown). After the positioning, thermocompression bonding of the two-layered FPC board 11 and the IC chip 20 is performed by using a thermocompression bonding tool (not shown) for applying a predetermined load thereon in a thermocompression bonding direction (that is, a vertical direction with respect to a surface of the two-layered FPC board 11 and the IC chip 20), which is shown in FIG. 2, and for creating a temperature condition of about 200° C.

As a result of the thermocompression bonding, the two-layered FPC board 11 and the IC chip 20 are bonded each other by a thermohardening reaction of the epoxy resin 15, while the inner-leads 13a to 13d and the bumps 18 are electrically connected each other via the conductive particles 16, which are crushed by the load, thereby producing the IC chip mounted structure in which the IC chip 20 is mounted on the two-layered FPC board 11. Note that, as shown in FIG. 2, a resist 14, which is an electric insulator, is applied and printed on the copper-foiled wires 13 located outside of the mounting region 21, thereby preventing a cross talk between the copper-foiled wires 13 themselves.

The following is an explanation on the designing rule for the length of the inner-leads 13a to 13d, with reference to FIG. 3. As discussed previously, in the present embodiment, the length of the inner-leads 13a to 13d are specified in accordance with the shape of the associating bumps 18 of the IC chip 20, in order to improve the reliability of the electrical connection of the IC chip mounted structure. Specifically, it is a preferable design that the inner-leads 13a to 13d are extended toward the inside-chip circuit (an electric circuit disposed on the circuit-formed surface 20a) so that their ends are located beyond the positions of the associating bumps 18. This design provides a margin to prevent the misregistration during the positioning step performed by the IC chip mounting apparatus. Thus, even in the case of the continuous operation, such as the mass production, the bumps 18 and the inner-leads 13a to 13d are surely associated (connected) via the anisotropic conductive material 17.

There is no specific limitation in a value of a length $d_1$ of the inner-leads 13a and 13d, where the length $d_1$ is from the positions of the bumps 18 to the ends of the inner-leads 13a to 13d toward the inside-chip circuit. But, it is more preferable that the length $d_1$ set in a range between 5 $\mu$m and 30 $\mu$m. Note that, the lowest value, 5 $\mu$m is set in accordance with a mounting ability (thus, accuracy of the positioning) of a common bonding apparatus for mass production (in other words, an apparatus for mounting and compression bonding for the two-layered FPC board 11 and the IC chip 20). However, it is also possible to set a lower value in accordance with the accuracy of the positioning of the mounting apparatus to be used. Moreover, the largest value, 30 $\mu$m is set, considering a size large enough to prevent such a drawback as a short circuit by a contact of the inner-leads 13a to 13d with the circuit-formed surface 20a of the IC chip 20, even when the inner-leads 13a to 13d are detached from the board 12 or twisted toward the IC chip 20 during the thermocompression bonding of the two-layered FPC board 11 and the IC chip 20. In addition, conventionally well known is an arrangement in which inner-leads are extended into an inside of device holes. But, there is no consideration for the length $d_1$, the part of the inner-leads beyond the bumps. Therefore, it has been concerned that such a drawback as the short circuit may be caused in the conventional arrangement.

Next, explained is a designing rule with respect to the widths of the inner-leads 13a to 13d, referring to FIG. 4. As described previously, the widths of the inner-leads 13a to 13d are specified in accordance with the shape of the associating bumps 18 of the IC chip 20, similar to the case of the lengths. Specifically, it is a preferable design that the widths $W_1$ of the inner-leads 13a to 13d are narrower than the widths $W_2$ of the associating bumps 18 of the IC chip 20.

It is considered that misregistration between the inner-leads 13a to 13d and the bumps 18 in terms of the cross direction is caused in accordance with (1) a total of pitch tolerances (a total of the wires pitch tolerances of the inner-leads 13a to 13d) of the two-layered FPC board 11, itself, or (2) positioning accuracy of the mounting apparatus for the IC chip 20. As shown by a wiring drawing in FIG. 4, the margin is provided for absorbing the effect of the misregistration, thereby ensuring the association (the connection) between the bumps 18 and the associating inner-leads 13a to 13d via the anisotropic conductive material 17, even in the case of the continuous operation such as the mass production. Thus, it is possible to avoid the leakage between adjacent terminals due to the misregistration in the cross direction, which are frequently caused when the bumps 18 of the IC chip 20 are given the finer pitches for increasing outputs.

There is no limitation in a difference ($W_2-W_1$) between the widths $W_2$ of the bumps 18 and the widths $W_1$ of the associating inner-leads 13a to 13d, but it is preferable to be designed that the difference is 5 $\mu$m or more. The numerical value of 5 $\mu$m is set, considering the mounting ability in terms of the positioning accuracy of the common bonding apparatus for mass production. But, it is also possible to set the value smaller than 5 $\mu$m. Moreover, the value of 5 $\mu$m is also set, considering that a finish tolerance (that is, a total of tolerances of the wire pitches of the copper-foiled wires 13) of the two-layered FPC board 11 itself. The finished tolerance is several $\mu$m in a direction along the long sides of the circuit-formed surface of the IC chip 20 that is mass-produced at present. However, it is also possible to set the value at smaller than the several $\mu$m, considering the finish accuracy of the units.

The setting of the length, width and the formation position of the inner-leads 13a to 13d are set so as to satisfy the conditions shown in FIGS. 3 and 4, considering the formation position and the shape of the bumps on the IC chip 20 to be mounted. This makes it possible that the areas of the superimposing regions of the inner-leads 13a to 13d are surely a product of the multiplication of the length $L_2$ of the bumps 18 by the width$_1$ of the inner-leads 13a to 13d, even in the case of the continuous operation, such as the mass production. With respect to facing two sides in the circuit-formed surface 20a having a substantially quadrangular shape, this easily provides equality between the sum of the superimposed areas of the inner-leads 13a with their associating bumps 18 on one of the facing two sides, and the sum of the areas in which the inner-leads 13b are superimposed with their associating bumps 18 on the other of the facing two sides.

As discussed above, it is possible to equalize the sums of the superimposed regions of the facing two sides by arranging the margin for countering the misregistration of the mounting position of the IC chip, which is affected by the formation position and shape of the bumps 18, even in the case of the continuous operation, such as the mass production.

Referring to FIGS. 1(a) and 1(b), the following is a detailed explanation on an example where a wiring structure of the two-layered FPC board 11 is formed in accordance with the designing rules that are illustrated in FIGS. 1(a), 1(b), 3, and 4. The IC chip 20, which is to be mounted on the mounting region 21 for IC chip in the two-layered FPC board 11, is provided with one hundred of the bumps 18 associated with the inner-leads 13a on the long size 21a with a bump pitch of 72 $\mu$m. The bumps 18 for the inner-leads 13a have a connection surface of a size of 50×80 $\mu$m ($W_2 \times L_2$). Meanwhile, associating whit the inner-leads 13b on the long side 21b, the IC chip 20 is also provided with seventy of the bumps 18 having a connection surface of a size of 70×90 $\mu$m ($W_2 \times L_2$) with a 110 $\mu$m bump pitch.

In view of the wire pitches, the inner-leads 13a on the long side 21a require a more strict wiring design specification, as the number of the inner-leads 13a is one hundred (N=100), outnumbering that of the inner-leads 13b, for being associated with more numbers of the bumps 18. Thus, the one hundred of the inner-leads 13a are provided in accordance with the designing rule shown in FIG. 4, so as to have the respective widths $W_1$ of 35 μm (=50 μm–15 μm). Note that, the width $W_1$ of the inner-leads 13a is set at 35 μm for the sake of a large connection area, that is, a larger superimposing region (in other words, in order to have more conductive particles 16 in the connection parts with the associating bumps 18), or ensuring a sufficient margin for countering the misregistration in the cross direction. But, of course, it is also possible to make it larger (45 μm at maximum) or smaller. In addition, the designing rule with respect to the length, shown in FIG. 3, is also applied in the provision of the one hundred of the inner-leads 13a.

Accordingly, 35×80 μm² is the area of the respective superimposed region in which each of the inner-leads 13a of one hundred is superimposed with one of the associating bumps 18, thus the sum S(N) of the superimposing regions $S_1$ through $S_N$ is calculated by an equation, 35×80×100= 280,000 μm².

Here, supposing that the designing rule for the lengths, which is illustrated in FIG. 3, is applied in, the width W1 of the inner-leads 13b should be 44.4 μm (280, 000÷70÷90≈44.4), respectively, so as to equalize the sum S(N) and the sum S(M) of the superimposing region $S^1$ to $S^M$ of the inner-leads 13b in the number of seventy, (here, with a difference about 0.1%). This substantially achieves equality between the long sides 21a and 21b, in terms of the pressures applied on the bonding interfaces between the bumps 18 and inner-leads 13a or 13b, respectively. Therefore, in is possible to achieve an excellent bonding reliability in the IC chip mounted structure on the FPC board.

On the other hand, when the two-layered FPC board 11 is designed to have inner-leads with the same width for the long sides 21a and 21b, as the conventional arrangement, the sum S(N) of the superimposing region for the long sides 21a will be greater than the sum S(M) of the superimposing region for the long sides 21b, because there is a difference between the long sides 21a and 21b in terms of the numbers of the bumps 18 to be associated with the inner leads 13a or 13b, respectively. This unbalances the bonding pressures (the pressure applied onto the joint parts) between the long sides 21a and 21b. As a result, the pressure applied between the inner-leads 13a and bumps 18 of the long side 21a will be insufficient to flatten (to crush) the conductive particles 18 in the anisotropic conductive material 17, thereby lowering the connection reliability (electric characteristics, such as connection resistance, for instance), for the each joint parts.

It should be noted that, in the concrete example, the inner-leads 13a to 13d, which are provided on sides of the mounting region, and their associating bumps 18 are arranged in the same shape. However, of course, it is not limited to the arrangement. For example, it may be arranged to let one of the sides be provided with various types of inner-leads 13a having different widths W1.

Moreover, the two-layered FPC board 11, which is shown in FIG. 1(a), is designed so as to equalize, with respect to the facing longs sides 21a and 21b of the mounting region 21, the sum S(N) of the areas of the superimposing regions $S_1$ to $S_N$ with the sum S(M) of the areas of the superimposing regions $S^1$ to $S^M$. Needless to say, it is more preferable to design that sums of the areas of the superimposing regions of the inner-leads 13c and 13d, relevant to the short sides 21c and 21d, the other pair of the sides facing each other. This achieves substantial equality in pressure balance during the compression bonding for the short sides 21c and 21d that facing each other, thereby improving the reliability of the electric connection between the two-layered FPC board 11 and the IC chip 20.

Note that, in the above case, the number of the inner-leads 13c provided on the short side 21c for being connected with associating bumps 18 may or may not be same as that of the inner-leads 13d provided on the short side 21d for being electrically connected with the associating bumps 18. Moreover, because the IC chip 20 is fundamentally rigid, it is expected that the bonding pressure during the mounting of the IC chip 20 is rarely unbalanced to a large extent, even if there is a difference between the sums of the superimposing areas of the inner-leads with respect to adjacent sides (for example between the long side 21a and the short side 21c). However, it is more preferable that, if it is possible in terms of the design, the sums of the areas between the adjacent sides are approximately equal to each other. This surely reduces the possibility of the severe unbalance in the bonding pressure during the mounting of the IC chip 20, thereby providing the IC chip mounting FPC board having the excellent bonding reliability.

As discussed so far, the FPC board, IC chip mounting FPC board, and the display apparatus the IC chip mounted structure incorporating same in accordance with the present embodiment are to be provided with the semiconductor IC chip that is mounted, for example, via the anisotropic conductive film or by the other means, with the arrangement in which the widths of the inner-leads are designed so as to have equality between the sums of the areas (widths of the wires×lengths of the bumps) of the superimposing parts of the copper-foiled wires (the inner-leads) with the bumps on the respective sides of the facing two sides, even when there is a difference between the facing two sides of the semiconductor integrated circuit chip that is to be heated and pressured, in terms of numbers of effective outputting bumps.

It is not limited to the present embodiment, in which explained is an example where the IC chip is mounted by using the anisotropic conductive film. For example, the bonding for mounting may be carried out by other means such an Au—Sn eutectic bonding. However, it is possible to provide the IC chip mounting FPC board having the excellent reliability of the electric connection by preventing the leakage between the adjacent terminals by using the anisotropic conductive film as the present embodiment.

Note that, meant by "numbers of effective outputting bumps" is "a sum of (a) bumps that are necessary for the IC chip to be connected with the wires (the inner-leads) to establish an electrical circuit, and (b) dummy bumps that are capable of ensuring areas of bonding parts to be the superimposing region by being connected with the wires (the inner-leads)

Moreover, when mounted to be is an IC chip having respectively different numbers of bumps on each side of at least one of pairs of the facing two sides of the circuit-formed surface in a substantially quadrangular shape, in an example of a suitable method of designing the wires (the inner-leads) on the FPC board, the inner-leads are designed in such a manner that: (1) the respective inner-leads are extended toward the IC chip circuit, so that the end of the respective inner-leads are beyond the position for bumps to be connected, while the respective inner-leads are narrower than the associating bumps, so that the areas of the superimposed region of each inner-lead, where the inner-lead and the associating bump are superimposed with each other, may be specified by calculating: the width of the inner-lead×the length of the bump, meanwhile 2) there is equality between the sums of the areas of the superimposing regions of the inner-leads associated with the bumps formed on each of the facing two sides.

Figure 5:
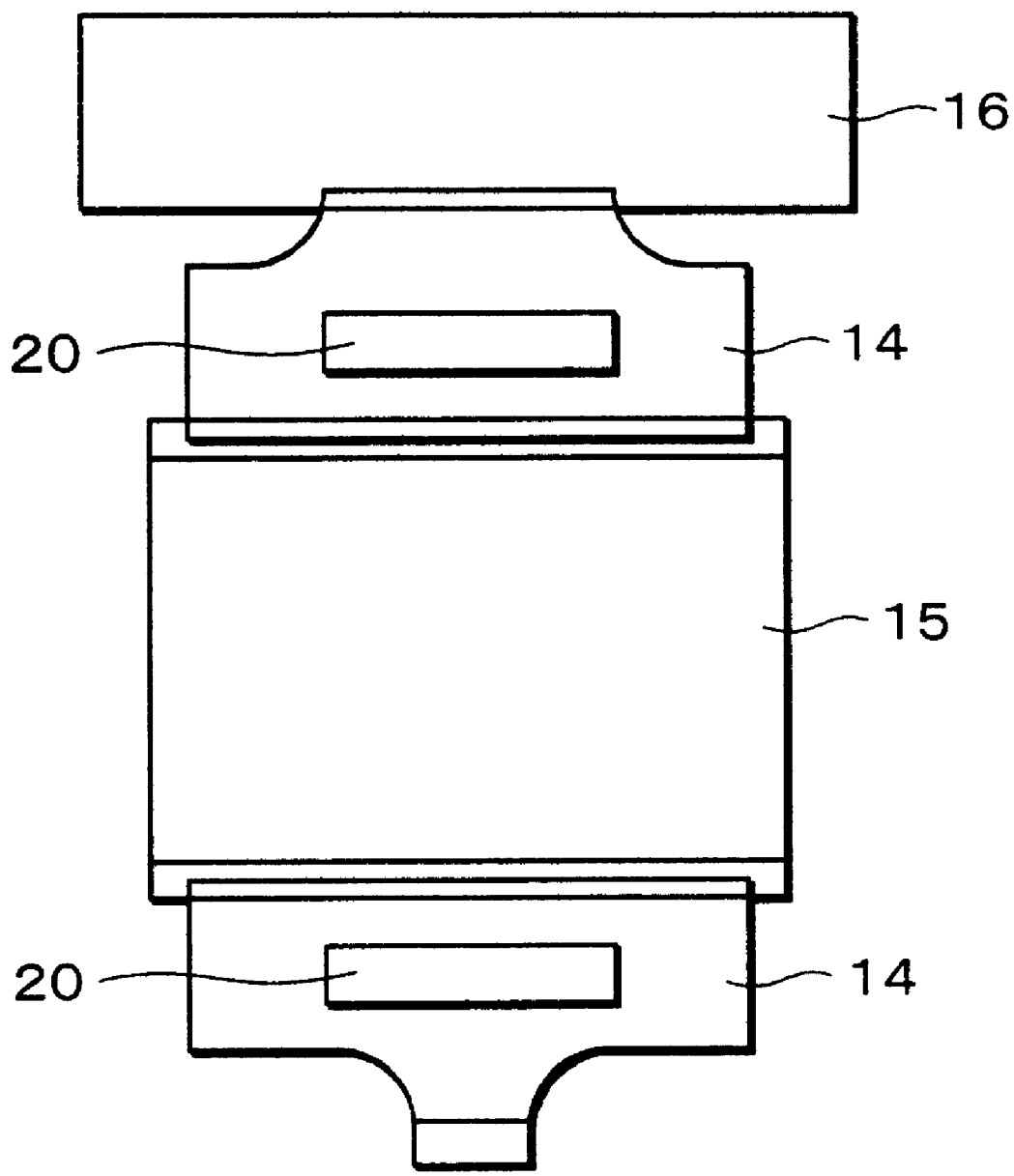
FIG. 5 is a plane view showing an example where the IC chip mounting FPC board shown in FIG. 1($a$) is incorporated in a display apparatus.

An example of a display apparatus incorporating the IC chip mounting FPC board of the present invention is shown in FIG. 5. This is a display apparatus in which COFs 14 are connected with a display apparatus 15. The COFs 14 are electronic units produced in accordance with the above-mentioned designing rules, and may be a unit produced by mounting the IC chip 20 on the IC chip mounting FPC board via the anisotropic conductive material, while the display apparatus 15 may be a conventional Liquid crystal display panel (LCD panel), a plastic LCD panel, or an organic electroluminescence (EL) display panel, for example.

Regarding the connection, the display apparatus 15, such as the LCD, may be connected with a single COF 14 on a single side or more than two COFs 14 on a plurality of sides, while the COF may be connected with other electronic units, or with another circuit unit, such as a PWB (which is a rigid board) 16.

With the arrangement, a display apparatus with an excellent bonding reliability can be attained because of the provision of the IC chip mounting FPC board in which the balance of the bonding pressure is considered for the mounting of the electronic units.

Furthermore, the IC chip mounting FPC board of the present invention may be an integrated circuit chip mounting flexible printed circuit board, provided with (a) an IC chip, (b) a mounting region in a substantially quadrangular shape for mounting an integrated circuit chip, and (c) a plurality of inner-leads, provided along each side of the mounting region, for being connected with bumps of the integrated circuit chip so that the integrated circuit chip is mounted and bonded in the mounting region, wherein the inner-leads are provided so as to have substantial equality between (a) a sum of areas of superimposing regions for the inner-leads provided on one of facing two sides and the bumps, and (b) a sum of areas of superimposing regions for the inner-leads provided on the other of the facing two sides and the bumps.

Further, the IC chip mounting FPC board of the present invention may be the integrated circuit chip mounting flexible printed board, wherein the inner-leads are provided so as to have substantial equality between (a) a sum of widths of the inner-leads provided on the one of the facing two sides, and (b) a sum of widths of the inner-leads provided on the other of the facing two sides.

Moreover, the IC chip mounting FPC board of the present invention may be the integrated circuit chip mounting flexible printed board, wherein at least a relationship: $S(N) \times M/N \leq S(M) \leq S(N)$ is satisfied, where (a) $S(N)$ is the sum of the areas of the superimposing regions for the inner-leads provided on the one of the facing two sides and the bumps, and (b) $S(M)$ is the sum of the areas of the superimposing regions for the inner-leads provided on the other of the facing two sides and the bumps, supposing an M number of the inner-leads are provided on the one of the facing two sides, while an N (>M) number of the inner-leads are provided on the other of the facing two sides.

Further, it is more preferable that the IC chip mounting FPC board of the present invention may be the integrated circuit chip mounting flexible printed board, wherein the inner-leads are provided so as to have substantial equality between (a) a sum of widths of the inner-leads provided on the one of the facing two sides, and (b) a sum of widths of the inner-leads provided on the other of the facing two sides.

Because of this, when the respective bumps, which belong to the IC chip to be mounted on the IC chip mounting FPC board, are formed with an identical length and with a predetermined margin so as to specify the areas of the superimposing region of the associating inner-leads by multiplying the widths of the inner-leads by the lengths of the bump, attained is the substantial equality between (a) the sum of the areas of the superimposing regions of the inner-leads provided on the one of facing two sides, and (b) the sum of the areas of the superimposing regions of the inner-leads provided on the other of the facing two sides, thereby equalizing the pressures applied on the respective inner-leads. This makes it possible to provide the IC chip mounting FPC board having the high bonding reliability, in which the bonding pressure is prevented from being unbalance during the mounting of the IC chip.

Moreover, it is more preferable that at least a relationship: $S(N) \times M/N \leq S(M) \leq S(N)$ is satisfied, where (a) $S(N)$ is the sum of the areas of the superimposing regions for the inner-leads provided on the one of the facing two sides and the bumps, and (b) $S(M)$ is the sum of the areas of the superimposing regions for the inner-leads provided on the other of the facing two sides and the bumps, supposing an M number of the inner-leads are provided on the one of the facing two sides, while an N (>M) number of the inner-leads are provided on the other of the facing two sides.

When at least the above relationship as to $S(N)$ and $S(M)$ is satisfied, attained is the substantial equality between (a) the sum of the areas of the superimposing region for the one of the facing two sides, and (b) the sum of the areas of the superimposing region for the other of the facing two sides, thereby substantially equalizing the pressures applied onto the respective inner-leads during the mounting of the IC chip in the mounting region.

By specifying the minimal requirement of the ration between the sums of the areas of the superimposing region of the respective facing two sides as explained above, it is possible to provide the IC chip mounting FPC board having a stable bonding reliability on a regular basis. In other words, when the relationship of N>N is satisfied between the M number and the N number of the inner-leads, at least, the smaller one of the sums ($S(N)$ and $S(M)$) of the areas of the superimposing regions is set to greater than or equal to the $M/N \times 100\%$ of the larger one, but to be less than or equal to the 100% of the larger one. In short, this makes it possible to provide the IC chip mounting FPC board having the high bonding reliability, by preparing the superimposing region in which the relationship: $S(N) \times M/N \leq S(M) \leq S(N)$ is satisfied.

Further, it is more preferable that the integrated circuit chip mounting flexible printed circuit board of the present invention is so arranged that the inner-leads are provided so as to have substantial equality between (a) the sum of the areas of the superimposing regions for the inner-leads provided on the one of the adjacent two sides and the bumps, and (b) the sum of the areas of the superimposing regions for the inner-leads provided on the other of the adjacent two sides and the bumps.

This provides the inner-leads having equality between the respective sums of the areas of the superimposing regions for the bumps of the IC chip and the inner-leads on the adjacent two sides of the mounting region. As a result, it is possible to provide the IC chip mounting FPC board having the excellent reliability, by preventing the bonding pressure from being unbalance during the mounting of the IC chip.

Moreover, it is more preferable that the inner-leads and the bumps are connected each other by using an anisotropic conductive material.

The leakage between the adjacent terminals is prevented by the use of the anisotropic conductive material for connecting, thereby providing the IC chip mounting FPC board having an excellent electric connection reliability.

It is more preferable that the inner-leads are provided so as to be extended by 5 $\mu$m to 30 $\mu$m toward a center part of the mounting region from the superimposing regions for the inner-leads and the bumps.

This prevents an inferior bonding between the IC chip and the IC chip mounting FPC board, by absorbing the effect of the misregistration in the longitudinal direction of the inner-leads during the mounting of the IC chip on the IC chip mounting FPC board.

The structure, in which the IC chip is mounted in the mounting region for the IC chip, requires a design of high positioning accuracy for the copper-foiled wiring on the FPC board. Therefore, the inner-leads are provided so as to be extended in that range beyond the bumps, so that an effect of a misregistration during the mounting of the IC chip may be absorbed. In addition, the specification of the upper limit at 30 $\mu$m prevents the drawbacks such as leakage caused by twisting the terminal.

Moreover, it is more preferable that the inner-leads are provided so as to have a width narrower by 5 $\mu$m or more, compared to a width of the bumps to be connected with the inner-leads.

This provides the margin for the misregistration that allows the bumps and the inner-leads to face each other, even when the IC chip is misregistered on the IC chip mounting FPC board. Accordingly, the leakage between the adjacent terminals is prevented.

Moreover, a display device of the present invention is provided with an integrated circuit chip mounting flexible printed circuit board, wherein the integrated circuit chip mounting flexible printed circuit board includes a mounting region in a substantially quadrangular shape for mounting an integrated circuit chip, and a plurality of inner-leads, provided along each side of the mounting region, for being connected with bumps of the integrated circuit chip so that the integrated circuit chip is mounted and bonded in the mounting region, wherein the inner-leads are provided so as to have substantial equality between (a) a sum of areas of superimposing regions for the inner-leads provided on one of facing two sides and the bumps, and (b) a sum of areas of superimposing regions for the inner-leads provided on the other of the facing two sides and the bumps.

With the above arrangement, it is possible to attain a display apparatus having an excellent bonding reliability, because provided is the IC chip mounting FPC board in which the bonding pressure is prevented from being unbalance during the mounting of the IC chip.

In order to solve the previously mentioned problems, a flexible printed circuit board of the present invention is provided with a mounting region in a substantially quadrangular shape, for mounting an integrated circuit, and a plurality of inner-leads extended into the mounting region, provided in such a manner that at least one of pairs of facing two sides of the mounting region are respectively provided with the inner-leads, which are for connection with bumps of the integrated circuit chip via an anisotropic conductive material, in different numbers from each other, wherein the inner-leads are provided so as to have substantial equality between (a) a sum of areas of superimposing regions of the inner-leads provided on one of facing two sides of the mounting region, and (b) a sum of areas of superimposing regions of the inner-leads provided on the other of the facing two sides, where the superimposing regions of the inner-leads are regions located on the inner-leads, in which the bumps and the inner-leads are superimposed each other when the integrated circuit chip is mounted.

With the above arrangement, substantially equalized are the pressure applied onto the respective inner-leads during the mounting of the IC chip, because there is the substantial equality between (a) the sum of the areas of the superimposing regions of the inner-leads provided on the one of the facing two sides, and (b) the sum of the areas of the superimposing regions of the inner-leads provided on the other of the facing two sides. In other words, it is possible to provide the FPC board in which the bonding pressure is prevented from being unbalance during the mounting of the IC chip.

In order to solve the previously-mention objects, an integrated circuit chip mounted structure of the present invention is produced by mounting an integrated circuit chip on a mounting region of a flexible printed circuit board, wherein the flexible printed circuit board includes a mounting region in a substantially quadrangular shape for mounting an integrated circuit chip, and a plurality of inner-leads extended into the mounting region, provided in such a manner that at least one of pairs of facing two sides of the mounting region are respectively provided with the inner-leads, which are for connection with bumps of the integrated circuit chip via an anisotropic conductive material, in different numbers from each other, wherein the inner-leads are provided so as to have substantial equality between (a) a sum of areas of superimposing regions of the inner-leads provided on one of facing two sides of the mounting region, and (b) a sum of areas of superimposing regions of the inner-leads provided on the other of the facing two sides, where the superimposing regions of the inner-leads are regions located on the inner-leads, in which the bumps and the inner-leads are superimposed each other when the integrated circuit chip is mounted, wherein (1) inner-leads provided on the flexible printed circuit board, and (2) bumps formed on the integrated circuit chip, are respectively connected each other via an anisotropic conductive material.

With the above arrangement, it is possible to provide the IC chip mounted structure having the excellent electric connection reliability.

A flexible printed circuit board of the present invention is provided with a mounting region in a substantially quadrangular shape for mounting an integrated circuit chip by using an anisotropic conductive material, and a plurality of inner-leads extended into the mounting region, provided in such a manner that at least one of pairs of facing two sides of the mounting region are respectively provided with the inner-leads, which are for connection with bumps of the integrated circuit chip via an anisotropic conductive material, in different numbers from each other, wherein the inner-leads are provided to have substantial equality between (a) a sum of widths of the inner-leads provided on the one of the facing two sides, and (b) a sum of widths of the inner-leads provided on the other of the facing two sides.

When the respective bumps, which belong to the IC chip to be mounted on the IC chip mounting FPC board, are formed with an identical length and with a predetermined margin so as to specify the areas of the superimposing region of the associating inner-leads by the equation: the widths of the inner-leads×the lengths of the bump, attained is the substantial equality between (a) a sum of areas of superimposing regions of the inner-leads provided on one of facing two sides, and (b) a sum of areas of superimposing regions of the inner-leads provided on the other of the facing two sides, thereby equalizing the pressures applied on the respective inner-leads. In short, this makes it possible to provide the FPC board in which the bonding pressure is prevented from being unbalance during the mounting of the IC chip.

In order to solve the previously-mentioned objects, an integrated circuit chip mounted structure of the present invention is produced by mounting an integrated circuit chip on a mounting region of a flexible printed circuit board, via connecting inner-leads of the flexible printed circuit board and bumps of the integrated circuit chip, wherein the flexible printed circuit board includes a mounting region in a substantially quadrangular shape, for mounting an integrated circuit chip by using an anisotropic conductive material, and a plurality of the inner-leads extended into the mounting region, provided in such a manner that at least one of pairs of facing two sides of the mounting region are respectively provided with the inner-leads, which are for connection with the bumps of the integrated circuit chip via an anisotropic conductive material, in different numbers from each other, wherein the inner-leads are provided to have substantial equality between (a) a sum of widths of the inner-leads provided on the one of the facing two sides, and (b) a sum of widths of the inner-leads provided on the other of the facing two sides, wherein (1) inner-leads provided on the flexible printed circuit board, and (2) bumps formed on the integrated circuit chip, are respectively connected each other via an anisotropic conductive material.

With the above arrangement, it is possible to provide the IC chip mounted structure having the excellent electric connection reliability.

In order to solve the previously-mention objects, a bonding method of an integrated circuit chip mounting flexible printed circuit board in accordance with the present invention includes steps of (1) forming a plurality of inner-leads, provided along each side of a mounting region in a substantially quadrangular shape for mounting an integrated circuit chip (2) connecting the inner-leads with bumps of the integrated circuit chip, so that the integrated circuit chip is mounted and bonded in the mounting region, wherein the forming of the inner-leads are carried out so that the inner-leads have substantial equality between (a) a sum of areas of superimposing regions for the inner-leads provided on one of facing two sides and the bumps, and (b) a sum of areas of superimposing regions for the inner-leads provided on the other of the facing two sides and the bumps.

With the above arrangement, substantially equalized are the pressure applied onto the respective inner-leads during the mounting of the IC chip, because there is the substantial equality between (a) the sum of the areas of the superimposing regions of the inner-leads provided on the one of the facing two sides, and (b) the sum of the areas of the superimposing regions of the inner-leads provided on the other of the facing two sides. This prevents the bonding pressure from being unbalance during the mounting of the IC chip. As a result, it is possible to provide the IC chip mounting FPC board having the high bonding reliability.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit chip mounting flexible printed circuit board, comprising:
   a mounting region in a substantially quadrangular shape for mounting an integrated circuit chip; and
   a plurality of inner-leads, provided along each side of said mounting region, for being connected with bumps of said integrated circuit chip so that said integrated circuit chip is mounted and bonded in said mounting region,
   wherein said inner-leads are provided so as to have substantial equality between (a) a sum of areas of superimposing regions for said inner-leads provided on one of facing two sides and said bumps, and (b) a sum of areas of superimposing regions for said inner-leads provided on the other of said facing two sides and said bumps.

2. The integrated circuit chip mounting flexible printed board as set forth in claim 1, wherein said inner-leads are provided so as to have substantial equality between (a) a sum of widths of said inner-leads provided on the one of said facing two sides, and (b) a sum of widths of said inner-leads provided on the other of said facing two sides.

3. The integrated circuit chip mounting flexible printed board as set forth in claim 1, wherein at least a relationship: $S(N) \times M/N \leq S(M) \leq S(N)$ is satisfied, where (a) $S(N)$ is the sum of the areas of said superimposing regions for said inner-leads provided on the one of said facing two sides and said bumps, and (b) $S(M)$ is the sum of the areas of said superimposing regions for said inner-leads provided on the other of said facing two sides and said bumps, supposing an M number of said inner-leads are provided on the one of said facing two sides, while an N number of said inner-leads are provided on the other of said facing two sides.

4. The integrated circuit chip mounting flexible printed board as set forth in claim 3, wherein said inner-leads and said bumps are connected to each other by using an anisotropic conductive material.

5. The integrated circuit chip mounting flexible printed board as set forth in claim 3, wherein said N number of said inner-lead is greater than said M number of said inner-lead.

6. The integrated circuit chip mounting flexible printed circuit board as set forth in claim 1, wherein said inner-leads are provided so as to have substantial equality between (a) the sum of the areas of said superimposing regions for said inner-leads provided on the one of said adjacent two sides and said bumps, and (b) the sum of the areas of said superimposing regions for said inner-leads provided on the other of said adjacent two sides and said bumps.

7. The integrated circuit chip mounting flexible printed circuit board as set forth in claim 1, wherein said inner-leads and said bumps are connected each other by using an anisotropic conductive material.

8. The integrated circuit chip mounting flexible printed circuit board as set forth in claim 1, wherein said inner-leads are provided so as to be extended by 5 μm to 30 μm toward a center part of said mounting region from said superimposing regions for said inner-leads and said bumps.

9. The integrated circuit chip mounting flexible printed circuit board as set forth in claim 1, wherein said inner-leads are provided so as to have a width narrower by 5 μm or more, compared to a width of said bumps to be connected therewith.

10. The integrated circuit chip mounting flexible printed board as set forth in claim 1, wherein an M number of said inner-leads provided on one of said facing two sides is different from so as not to be equal to an N number of said inner-leads provided on the other of said facing two sides.

11. A display device, comprising:
    an integrated circuit chip mounting flexible printed circuit board, wherein said integrated circuit chip mounting flexible printed circuit board including:
a mounting region in a substantially quadrangular shape for mounting an integrated circuit chip; and
a plurality of inner-leads, provided along each side of said mounting region, for being connected with bumps of said integrated circuit chip so that said integrated circuit chip is mounted and bonded in said mounting region,
wherein said inner-leads are provided so as to have substantial equality between (a) a sum of areas of superimposing regions for said inner-leads provided on one of facing two sides and said bumps, and (b) a sum of areas of superimposing regions for said inner-leads provided on the other of said facing two sides and said bumps.

12. The integrated circuit chip mounting flexible printed board as set forth in claim 11, wherein an M number of said inner-leads provided on one of said facing two sides is different from so as not to be equal to an N number of said inner-leads provided on the other of said facing two sides.

13. A flexible printed circuit board, comprising:
a mounting region in a substantially quadrangular shape for mounting an integrated circuit; and
a plurality of inner-leads extended into said mounting region, provided in such a manner that at least one of pairs of facing two sides of said mounting region are respectively provided with said inner-leads, which are for connection with bumps of said integrated circuit chip via an anisotropic conductive material, in different numbers from each other,
wherein said inner-leads are provided so as to have substantial equality between (a) a sum of areas of superimposing regions of said inner-leads provided on one of facing two sides of the mounting region, and (b) a sum of areas of superimposing regions of said inner-leads provided on the other of the facing two sides, where said superimposing regions of said inner-leads are regions located on said inner-leads, in which said bumps and said inner-leads are superimposed each other when said integrated circuit chip is mounted.

14. An integrated circuit chip mounted structure, produced by mounting an integrated circuit chip on a mounting region of a flexible printed circuit board,
wherein said flexible printed circuit board, including:
a mounting region in a substantially quadrangular shape for mounting an integrated circuit chip; and
a plurality of inner-leads extended into said mounting region, provided in such a manner that at least one of pairs of facing two sides of said mounting region are respectively provided with said inner-leads, which are for connection with bumps of said integrated circuit chip via an anisotropic conductive material, in different numbers from each other,
wherein said inner-leads are provided so as to have substantial equality between (a) a sum of areas of superimposing regions of said inner-leads provided on one of facing two sides of the mounting region, and (b) a sum of areas of superimposing regions of said inner-leads provided on the other of the facing two sides, where said superimposing regions of said inner-leads are regions located on said inner-leads, in which said bumps and said inner-leads are superimposed each other when said integrated circuit chip is mounted,
wherein (1) inner-leads provided on said flexible printed circuit board, and (2) bumps formed on said integrated circuit chip, are respectively connected each other via an anisotropic conductive material.

15. A flexible printed circuit board, comprising:
a mounting region in a substantially quadrangular shape for mounting an integrated circuit chip by using an anisotropic conductive material; and
a plurality of inner-leads extended into said mounting region, provided in such a manner that at least one of pairs of facing two sides of said mounting region are respectively provided with said inner-leads, which are for connection with bumps of said integrated circuit chip via an anisotropic conductive material, in different numbers from each other,
wherein said inner-leads are provided to have substantial equality between (a) a sum of widths of said inner-leads provided on the one of said facing two sides, and (b) a sum of widths of said inner-leads provided on the other of said facing two sides.

16. An integrated circuit chip mounted structure, produced by mounting an integrated circuit chip on a mounting region of a flexible printed circuit board, via connecting inner-leads of said flexible printed circuit board and bumps of said integrated circuit chip,
wherein said flexible printed circuit board, including:
a mounting region in a substantially quadrangular shape, for mounting an integrated circuit chip by using an anisotropic conductive material; and
a plurality of said inner-leads extended into said mounting region, provided in such a manner that at least one of pairs of facing two sides of said mounting region are respectively provided with said inner-leads, which are for connection with said bumps of said integrated circuit chip via an anisotropic conductive material, in different numbers from each other,
wherein said inner-leads are provided to have substantial equality between (a) a sum of widths of said inner-leads provided on the one of said facing two sides, and (b) a sum of widths of said inner-leads provided on the other of said facing two sides,
wherein (1) inner-leads provided on said flexible printed circuit board, and (2) bumps formed on said integrated circuit chip, are respectively connected each other via an anisotropic conductive material.

17. A bonding method of an integrated circuit chip mounting flexible printed circuit board, comprising steps of:
forming a plurality of inner-leads, provided along each side of a mounting region in a substantially quadrangular shape for mounting an integrated circuit chip; and
connecting said inner-leads with bumps of said integrated circuit chip, so that said integrated circuit chip is mounted and bonded in said mounting region,
wherein the forming of the inner-leads are carried out so that said inner-leads have substantial equality between (a) a sum of areas of superimposing regions for said inner-leads provided on one of facing two sides and said bumps, and (b) a sum of areas of superimposing regions for said inner-leads provided on the other of said facing two sides and said bumps.

18. A bonding method as set forth in claim 17, wherein an M number of said inner-leads provided on one of said facing two sides is different from so as not to be equal to an N number of said inner-leads provided on the other of said facing two sides.

* * * * *